United States Patent [19]

Ishida

[11] 4,091,405

[45] May 23, 1978

[54] INSULATED GATE FIELD EFFECT TRANSISTOR

[75] Inventor: Akira Ishida, Musashino, Japan

[73] Assignee: Nippon Telegraph and Telephone Public Corporation, Tokyo, Japan

[21] Appl. No.: 711,178

[22] Filed: Aug. 3, 1976

[30] Foreign Application Priority Data

Aug. 14, 1975 Japan .................................. 50-98092

[51] Int. Cl.$^2$ ........................................... H01L 29/78
[52] U.S. Cl. ......................................... 357/23; 357/89
[58] Field of Search ............................. 357/23, 89, 91

[56] References Cited

U.S. PATENT DOCUMENTS

| 3,868,187 | 2/1975 | Masuoka | 357/23 |
| 3,891,190 | 6/1975 | Vadasz | 357/23 X |
| 3,936,857 | 2/1976 | Ota | 357/23 |

Primary Examiner—Stanley D. Miller, Jr.
Assistant Examiner—James W. Davie
Attorney, Agent, or Firm—Watson, Cole, Grindle & Watson

[57] ABSTRACT

An insulated gate field effect transistor wherein a source region and drain region having the conduction type opposite to that of the semiconductor substrate of one conduction type being formed in said semiconductor substrate at a distance, the surface of said semiconductor substrate in the channel region between said source region and drain region being provided with an insulated gate electrode, first and second high conduction regions having the same conduction type as that of said semiconductor and higher conductivity being formed to conform to predetermined longitudinal length along the channel and arranged so as to engage with the entire area of the source region and drain region or engage with the portion of the source region and drain region in the channel region and characterized by reduced threshold voltage drop and elimination of dependency of threshold voltage on the processing precision as a result of shortened channel.

4 Claims, 9 Drawing Figures

INSULATED GATE FIELD EFFECT TRANSISTOR

BACKGROUND OF THE INVENTION

1. Field of the Invention

The present invention relates to an insulated gate field effect transistor and more particularly to a short channel insulated-gate field effect transistor.

2. Description of the Prior Art

In conventional insulated-gate field effect transistors which are a basic component of MOSLSI (metal oxide semiconductor large scale integration), with the reduction of the length between the source and drain formed on the semiconductor substrate at a distance, the channel length, threshold voltage, far example are markedly reduced and also such parameters are greatly affected by the dimensional precision of the channel length.

As a solution to this problem, a proposal has been made to reduce the planar dimension of the channel length and also to reduce the sectional dimension of each element in the same proportion. However, according to this proposal, extremely small values are required for the dimensions such as the thickness of the gate insulating film, the depth of the source and drain, etc., with resultant very severe fabricating condictions and markedly reduced yield of MOSLSI, etc.

Moreover, it has also been proposed to form opposing sides of the source and drain into the shape of a wedge or an arrowhead. However, according to the IBM Technical Disclosure Bulletin, Vol. 16, No. 2 July, 1973, P. 652, "Reduction of the Small Channel Effect in an IGFET Structure, the practical application of the above proposal has failed due to serious deterioration of the power gain as well as an inability to permit free selection of the power gain.

On the other hand, a proposal (U.S. Pat. No. 3,600,647 P. V. Gray) has been made to form a shallow high conduction layer over the entire area of the channel region by means of ion implantation, etc. in order to prevent a threshold voltage drop resulting from the shortening of the channel length. However, this proposal is ineffective for the elimination of the dependency of the threshold voltage on the channel length precision.

SUMMARY OF THE INVENTION

An insulated-gate field effect transistor according to the present invention is composed of a semiconductor substrate having one conduction type, a source and a drain regions formed in the semiconductor substrate so as to be at a distance from each other and having a conduction type opposite to that of the semiconductor substrate. The source and drain regions being further arranged to engage at least in a channel region with the channel region located between the source region and drain region. A gate insulating layer is arranged over the surface of the semiconductor substrate in the channel region and an insulated gate electrode is disposed on the gate insulation layer and the first and the second high conductive regions.

An object of the present invention is to provide an insulated gate field effect transistor with reduced threshold voltage drop and minimized dependency of threshold voltage on the processing precision resulting from reduced channel length.

DETAILED DESCRIPTION OF THE INVENTION

Figure 1:
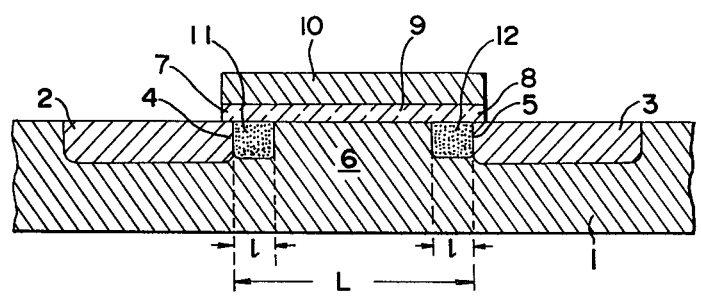
FIG. 1 shows the section of an IGFET with reference to one embodiment according to the present invention.
Figure 2:
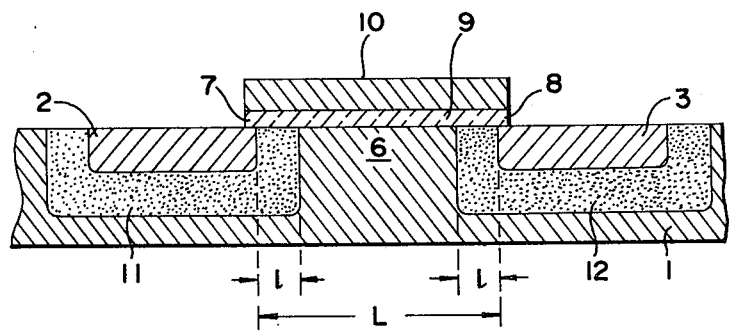
FIG. 2 illustrates a section of the IGFET with reference to another embodiment according to the present invention.

The insulated gate field effect transistor according to the present invention is of the structure shown in FIG. 1 and 2. Referring now to FIG. 1, on a semiconductor substrate 1 of one conduction type, e.g., p-type, are formed the source 2 of the opposite conduction type, e.g., n-type, and the drain 3 spaced from the drain by a distance and between the corresponding sides 4 and 5 of the source 2 and the drain 3 is formed the channel region 6 extending for a distance L (channel length).

On the top side of the semiconductor substrate 1 is provided a flat gate insulating layer 9 so that the ends 7, 8 thereof engage with the source 2 and the drain 3. Layer 9 covers the channel region 6 of the semiconductor substrate 1 with an insulated gate electrode 10 of the same width as the layer 9 which is evaporated on the layer 9.

According to the present invention, there are provided in the channel region 6 a high conductive region 11 of the same conduction type as the substrate 1 in contact with the side 4 of the source 2 and another high conductive region 12 of the same conduction type as the substrate 1 in contact with the side 5 of the drain 3. Highly conductive regions 11, 12 are of the width $l$ is the longitudinal direction of the channel maintaining a predeteredetermined distance between each other without being engaged.

The top surfaces of the semiconductor substrate 1, the source 2, the drain 3 and the high conductive regions 11, 12 are in the same plane.

A theoretical analysis relative to threshold voltage drop phenomenon resulting from the reduction of channel length of an IGFET is disclosed in "Solid State Electronics" Vol. 16 (1973) pp 1407 − 1417, by H. S. Lee.

Threshold voltage $V_{th} =$ (1)

$$V_{th\ long} - \frac{\xi}{C_{ox}L} \{A_0 + A_1 X_j + A_2 X_j^2\}$$

In connection, the following equations have been developed.

$$V_{th\ long} = (\Phi'_{MS} - \frac{Q_{sseff}}{C_{ox}}) + B\Phi_{FP} + \frac{1}{C_{ox}} \sqrt{[2K_{Si}\epsilon_o q N_A(V_{sub} + B\Phi_{FP})]} \quad (2)$$

$$A_0 = K_{Si}\epsilon_0 \left\{ \sqrt{V_{sub} + B\Phi_{FP}} \sqrt{V_{sub} + KV_d + V_{Bi}} - (V_{sub} - B\Phi_{FP}) + \right. \tag{3}$$

$$\left. (KV_d + V_{Bi} - B\Phi_{FP}) \ln \left[ \frac{\sqrt{V_{sub} + B\Phi_{FP}} + \sqrt{V_{sub} + KV_d + V_{Bi}}}{\sqrt{KV_d + V_{Bi} - B\Phi_{FP}}} \right] \right\}$$

$$A_1 = \sqrt{2K_{Si}\epsilon_0 qN_A} \left\{ \sqrt{V_{sub} + V_{Bi}} + \sqrt{V_{sub} + KV_d + V_{Bi}} - \sqrt{V_{Bi}} - \sqrt{KV_d + V_{Bi}} \right\} \tag{4}$$

$$A_2 = qN_A \ln \frac{X_j + \sqrt{\left(\frac{2K_{Si}\epsilon_0}{qN_A}(V_{sub} + KV_d + V_{Bi})\right)} X_j + \sqrt{\left(\frac{2K_{Si}\epsilon_0}{qN_A}(V_{sub} + V_{Bi})\right)}}{\sqrt{\left(\frac{2K_{Si}\epsilon_0}{qN_A}(KV_d + V_{Bi})\right)} X_j + \sqrt{\left(\frac{2K_{Si}\epsilon_0}{qN_A} V_{Bi}\right)}} \tag{5}$$

Based on the same analytical method, this inventor has tried to develop a threshold voltage formula as shown below with respect to the structure of an IGFET as shown in FIGS. 1 and 2 according to the present invention.

Figure 3:
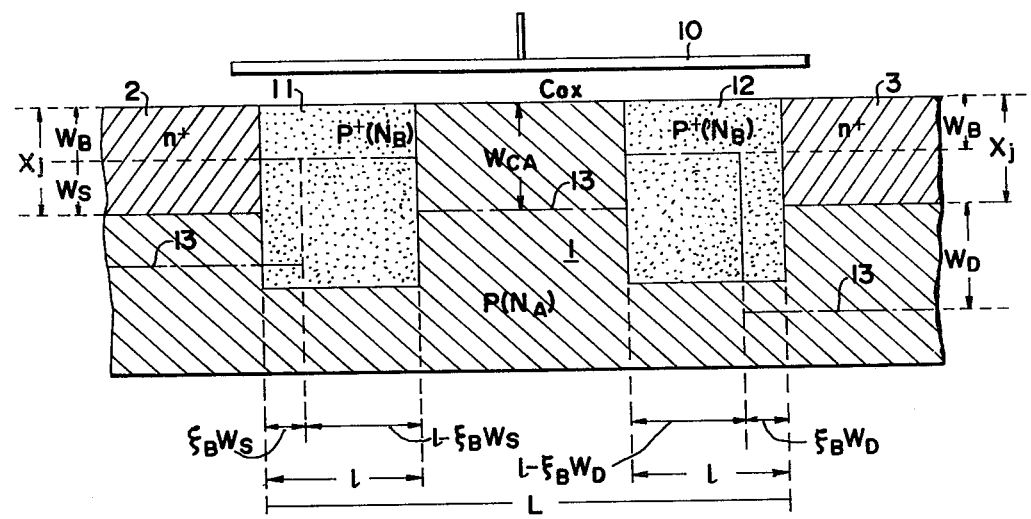
FIG. 3. is a schematic section illustrating the embodiment shown in FIGS. 1 and 2.

The process of developing this formula will be described referring to FIG. 3 which shows a model of the embodiments illustrated in FIGS. 1 and 2.

Where the length $l$ of a high conductivity region in the longitudinal direction of the channel satisfies $\frac{l}{2} \geq l \geq \xi_B W_D$ ($\xi_B$ represents the proportion in which the depletion layer 13 projects in the direction of the channel region 6. $W_D$ expresses the depth of the depletion layer formed on the drain 3 side), each symbol in FIG. 3 may be represented by the following equations.

Elongation (extension) of the depletion layer extending on the source 2 side $$W_S = \sqrt{\frac{2K_{Si}\epsilon_0}{qN_B}(V_{sub} + V_{Bi})}$$

Elongation of the depletion layer extending in the channel region 6

$$W_{CA} = \sqrt{\frac{2K_{Si}\epsilon_0}{qN_A}(V_{sub} + B\Phi_{FP})}$$

Elongation of the depletion layer formed on the drain 3 side $$W_D = \sqrt{\frac{2K_{Si}\epsilon_0}{qN_B}(V_{sub} + KV_d + V_{Bi})}$$

Elongation of the depletion layer in the channel region in the high conductive regions 11, 12

$$W_{CB} = \sqrt{\frac{2K_{Si}\epsilon_0}{qN_B}(V_{sub} + B\Phi_{FP})}$$

Proportion in which the depletion layer projecting in the direction of the channel $\xi_B = \xi_0 \sqrt{6 \times 10^{15}/N_B}$ Fermi potential of substrate $$1\Phi_{FP} = kT\ln\left\{\frac{1}{2}\left[\frac{N_A}{n_i} + \sqrt{(\frac{N_A}{n_i})^2 + 4}\right]\right\}$$

Fermi potential of high conductive regions 11, 12

$$\Phi_{FB} = kT\ln\left\{\frac{1}{2}\left[\frac{N_B}{n_i} + \sqrt{(\frac{N_B}{n_i})^2 + 4}\right]\right\}$$

where
$K_{Si}\epsilon_0$ = dielectric constant of silicon
$q$ = electric charge of electron
$N_B$ = concentration of impurities in high conductive region 11
$V_{sub}$ = voltage across substrate 1
$V_{Bi}$ = built-in potential
$N_A$ = concentration of impurities in high conductive region 12
$B$ = inversion coefficient
$KV_d$ = effective drain voltage determining threshold
$k$ = Boltzman constant
$T$ = temperature of substrate
$n_i$ = intrinsic impurity concentration This inventor has developed the following threshold voltage formulas through the H. S. Lee method based on the above equations related to FIG. 3.

$$V_{th} = V_{th\,long} - \frac{\xi_B}{LC_{ox}}\{(A_0 - A_0^2) + A_1 X_j + A_2 X_j^2\} \tag{6}$$

$$V_{th\,long} = \Phi'_{MS} - \frac{Q_{sseff}}{C_{ox}} + B\Phi_{FP} + \frac{1}{C_{ox}}\sqrt{2K_{si}\epsilon_0 qN_A(V_{sub} + B\Phi_{FP})} \tag{7}$$

-continued $$A_0 = K_{Si}\epsilon_0 \left\{ \sqrt{V_{sub} + B\Phi_{FB}} \quad \sqrt{V_{sub} + KV_d + V_B} - (V_{sub} - B\Phi_{FB}) + \right. \tag{8}$$

$$\left. (KV_d + V_{Bi} - B\Phi_{FB}) \ln\left[ \frac{\sqrt{V_{sub} + B\Phi_{FB}} + \sqrt{V_{sub} + KV_d + V_{Bi}}}{\sqrt{KV_d + V_{Bi} - B\Phi_{FB}}} \right] \right\}$$

$$A_0^* = \left(\frac{2l}{\xi_B}\right)\left\{ \sqrt{2K_{Si}\epsilon_0 qN_B(V_{sub} + B\Phi_{FB})} - \sqrt{2K_{Si}\epsilon_0 qN_A(V_{sub} + B\Phi_{FP})} + C_{ox}B(\Phi_{FB} - \Phi_{FP}) \right\} \tag{9}$$

$$A_1 = \sqrt{2K_{Si}\epsilon_0 qN_B}\left\{ \sqrt{V_{sub} + V_{Bi}} + \sqrt{V_{sub} + KV_d + V_{Bi}} - \sqrt{KV_d + V_{Bi}} - \sqrt{V_{Bi}} \right\} \tag{10}$$

$$A_2 = qN_B \ln\left\{ \frac{X_j + \sqrt{\frac{2K_{Si}\epsilon_0}{qN_B}(V_{sub} + KV_d + V_{Bi})}}{X_j + \sqrt{\frac{2K_{Si}\epsilon_0}{qN_B}(KV_d + V_{Bi})}} \cdot \frac{X_j + \sqrt{\frac{2K_{Si}\epsilon_0}{qN_B}(V_{sub} + V_{Bi})}}{X_j + \sqrt{\frac{2K_{Si}\epsilon_0}{qN_B} \cdot V_{Bi}}} \right\} \tag{11}$$

$$\left(\frac{l}{\xi_B}\right)^2 \geq \frac{2K_{Si}\epsilon_0}{qN_B}(V_{sub} + KV_{Bi})$$

As might be apparent from the comparison of the above equations and the H. S. Lee equation, the present invention is characterized by the appearance of the term $A_0^*$.

Accordingly, one and only one width $l$ of the high conductive regions 11, 12 which satisfies $$(A_0 - A_0^*) + A_1X_j + A_2X_j^2 = 0 \tag{12}$$

with respect to $A_0$, $A_1$, $A_2$, $X_j$, $X_j^2$, etc., can be determined.

Under the condition satisfying Eq. (12), the threshold voltage of the short channel insulated gate field effect transistor according to the present invention becomes $V_{th} = V_{th\,long}$, hence any dependency on the length L of channel region is eliminated.

Figure 4:
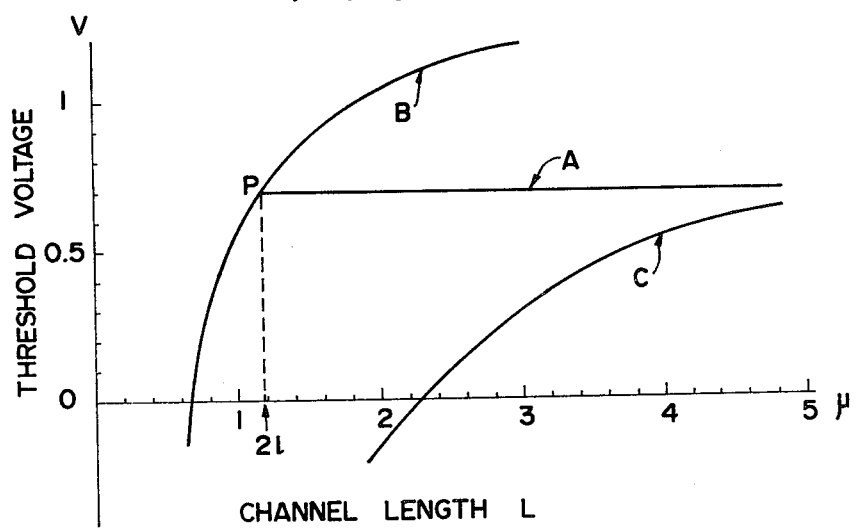
FIG. 4 is a graphic representation for determining the structure of the IGFET according to the present invention.

The solution of this Eq. (12) can be easily obtained graphically. First, the concentration $N_A$ of impurities in substrate 1 is selected according to Eq. (7) so as to obtain a desired threshold voltage ($V_{th} = 0.3 - 1V$ is practical). Then, Curve C in FIG. 4 is drawn using Eq. (1) by H. S. Lee. While, for the ordinary IGFET fabricating process where silicon monocrystal and silicon dioxide are used for semiconductor substrate 1 and gate insulating layer 9, respectively, in the above Eq. (7), $$\Phi'_{MS} - \frac{Q_{ss\,eff}}{C_{ox}} + B\Phi_{FP} \simeq 0.4 \text{ volt}$$

$K_{Si}\epsilon_0 = 1.06 \times 10^{-10}$ Farad/m
$q = 1.6 \times 10^{-19}$ Coulomb.

Accordingly, approximated impurity concentration $N_A$ may preferably selected based on $$N_A \simeq 3 \times 10^{21} \times \left(\frac{V_{th} + 0.4}{T_{ox}}\right)^2 / V_{sub} \tag{13}$$

With the thickness $T_{ox}$ of gate insulating layer 9 determined in consideration of the production yield (according to H. S. Lee, it can be related in terms of gate capacitance $C_{ox}$ in Eq. (2), dielectric constant $K_{ox}\epsilon_0$ of gate insulating layer and $C_{ox} = K_{ox}\epsilon_0/T_{ox}$) and substrate voltage $V_{sub}$ determined as a design condition of a circuit employing such IGFET (1 − 5V is practical). The units of $N_A$, $V_{th}$, $T_{ox}$ and $V_{sub}$ are cm$^{-3}$, V, Å and V, respectively. When practical values of $V_{th}$, $T_{ox}$, $V_{sub}$, etc. are taken into account, $1 \times 10^{15} - 1 \times 10^{16}$ cm$^{-3}$ is determined as the preferable value of substrate impurity concentration $N_A$ from Eq. (13).

On the other hand, in order to prevent dielectric breakdown of the pn junction between the source 2 and drain 3, the impurity concentration $N_B$ of high conductive regions 11, 12 are selected to have the value somewhat of the order of $1 \times 10^{16} - 2 \times 10^{16}$ cm$^{-3}$, $N_A$ is Eqs. (2) and (5) is replaced with $N_B$ and the curve B is drawn according to Eq. (1).

Then, asymptote A of curve C (represented by $V_{th} = V_{th\,long}$) is drawn and the intersection point P of curve B and asymptote A is found. This intersection point P correspond to the condition where the entire channel region 6 is completely filled with the high conductive region. Accordingly, the point where the intersection point P is projected on the longitudinal axis of the channel gives twice the width $l$ of one high conductive region in the longitudinal direction of the channel (i.e. the sum of the width of high conductive regions 11 and 12).

For fabricating an IGFET of desired channel length and threshold voltage according to the above mentioned procedure, the impurity concentration of the substrate material and the high conductive region is first determined and then the dimension $l$ of the high conductive region in the longitudinal direction of the channel can be set.

It should be noted here that the dimension $l$ of the high conductive region must be determined so as to satisfy the above mentioned condition $L/2 \leq l \leq \xi_B W_D$ when the threshold voltage formula (6) characteristic of the present invention is introduced. When the variation of channel length L in the fabrication of an IGFET according to the present invention, power voltage ($V_{sub}$, $V_D$, etc.) in the formation of a circuit using IGFET according to the present invention and so on are taken into consideration, it is preferable to set the proportion of the above dimension $l$ and channel length L within a rough range satisfying $1/7 \leq l/L \leq 2/5$.

In another embodiment shown in FIG. 2, high conductive regions 11, 12 are formed to cover not only the side 4 of the source 2 or the side 5 of the drain 3 but also the entire side areas of source 2 and drain 3 and the bottom. Other factors, e.g., the width of high conductive regions 11, 12, channel length L, etc., are the same as those of the first embodiment in FIG. 1.

An IGFET according to the present invention can be fabricated simply and with ease. An example of a fabrication process for the first embodiment in FIG. 1 will now be described with reference to FIGS. 5A through 5E.

Figure 5A:
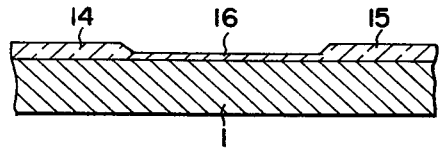
FIGS. 5A through 5E illustrate the process for fabricating the IGFET according to the present invention.

First, the surface of substrate 1 is field-oxidized to form oxide films (e.g., $SiO_2$) 14, 15, and then the central part is etched to form a gate oxide film 16 (this corresponds to gate insulating film 9 in FIG. 1) (FIG. 5A).

Then, a gate electrode 10 is evaporated over the gate oxide film 16, the gate oxide film 16 between the gate electrode 10 and oxide films 14, 15 is etched to obtain a window 17 through which the source 2 and drain 3 are to be formed. (FIG. 5B)

Figure 5B:
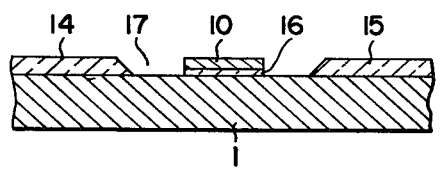
Figure 5C:
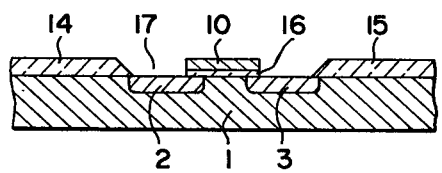
Figure 5D:
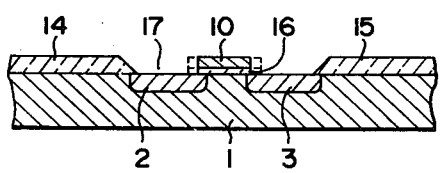

Subsequently, a substance, e.g. phosphorus, of high concentration is diffused to form the source 2 and the drain 3 as shown in FIG. 5C and both sides of the assembly of the gate electrode 10 and gate oxide film 16 are etched for the amount corresponding to a predetermined dimension $l$ of the high conductive region (over←etching) (FIG. 5D).

Figure 5E:
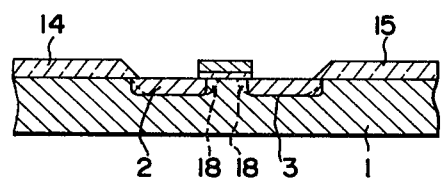

Then, a substance, e.g., boron ion, of a given concentration is implanted in the source 2 and the drain 3 through the window 17 using the over-etched gate electrode 10 as the mask and an ion implanted layer 18 marked with a dotted line in FIG. 5E is formed. Thereafter, through heat treatment the implanted ion is activated and high conductive regions 11, 12 as shown in FIG. 1 are formed.

For fabricating an IGFET in accordance with the second embodiment shown in FIG. 2, the same processes in FIG. 5A and 5B are followed and then, before the formation of source 2 and drain 3, high conductive regions 11, 12 are formed by the thermal diffusion of, for example, boron using the gate electrode 10 as the mask and then a substance, e.g., phosphorus, of high concentration is diffused to form the source 2 and drain 3. Dimension $l$ of high conductive regions 11, 12 is determined by the difference in diffusion distance between, for example, the diffused boron and phosphorus.

Examples according to the present invention will now be described.

EXAMPLE 1

An IGFET according to the present invention, to obtain threshold voltage $V_{th} = 0.7$ volt under the condition of selected channel length $L = 2\mu$ and substrate voltage $V_{sub} = 2$ volts, it is appropriate to select each structural constant of the FET as follows:

| | |
|---|---|
| Channel length | $2\mu$ |
| Substrate impurity concentration | $3.5 \times 10^{15} cm^{-3}$ |
| Gate oxide film thickness | 700A |
| Depth of source and drain | $0.5\mu$ |
| High conductive region width $l$ | $0.55\mu$ |
| High conductive region impurity concentration | $1 \times 10^{16} cm^{-3}$ |

In practice, to achieve the above values precisely is impossible and certain fabrication variations are inevitable, which result in deviation of the threshold voltage in an IGFET from the designed value.

A number of IGFETS of the above structure were fabricated and the threshold voltage of each one was measured. The result thereof indicates that threshold voltage of an IGFET according to the present invention comes within the range of $0.7V \pm 24\%$.

While, an IGFET according to the prior art, with the optimum structural constants of

| | |
|---|---|
| Channel length | $2\mu$ |
| Substrate impurity concentration | $1.5 \times 10^{16} cm^{-3}$ |
| Gate oxide film thickness | 350A |
| Depth of source and drain | $0.5\mu$ | threshold voltage comes within the range of $0.7V \pm 35\%$.

The above fact signifies that with an IGFET according to the present invention the fabrication variation of the threshold voltage is smaller than that with an IGFET according to the prior art and the threshold value is more uniform.

EXAMPLE 2

The fabrication variation of the threshold voltage as in Example 1 was checked on an IGFET with channel length $L = 1.5\mu$.

The result thereof showed far more effective suppression of the fabrication variation as shown in the table below.

| Structural Constants of The Invention | | |
|---|---|---|
| | Present invention | Prior art |
| Channel length | $1.5\mu$ | $1.5\mu$ |
| Substrate impurity concentration | $3.5 \times 10^{15} cm^{-3}$ | $1.7 \times 10^{16} cm^{-3}$ |
| Gate oxide film thickness | 700A | 350A |
| Depth of source or drain | $0.5\mu$ | $0.5\mu$ |
| High conductive region width | $0.55\mu$ | — |
| High conductive region impurity concentration | $1 \times 10^{16} cm^{-3}$ | — |

According to this example, while the threshold voltage of an IGFET according to the present invention comes within the range of $0.7V \pm 26\%$, that according to the prior art is within $0.7V \pm 44\%$, which is a more serious deviation than that in Example 1.

As might be apparent from the above description, in an IGFET according to the present invention, the scatter of characteristics due to the processing precision of the channel length is minimized and the condition imposed on dimensional precision of the LSI pattern, etc. is greatly alleviated. Moreover, the scatter of the LSI performance is reduced resulting in a high performance MOSLSI, etc., increased yield and many other favorable effects.

I claim:

1. An insulated gate field effect transistor comprising:
   a semiconductor substrate of one conduction type;
   spaced source and drain regions formed beneath and extending to one surface of said semiconductor substrate and each of the opposite conduction type to that of said semiconductor substrate;
   a channel region provided between said source and drain regions at least at said one surface of said substrate;

a gate insulating layer covering at least the surface of said channel region on said one surface of the substrate;

an insulated gate electrode disposed on said gate insulating layer;

two conductive regions of the same conduction type and having higher conductivity than that of said substrate and having a transverse dimension at least equal to that of said source and drain regions, a longitudinal dimension ranging from 1/7 to 2/5 times the spacing between said source and drain region, and contacting the transverse edges of said source and drain regions, respectively, at least at said surface of the substrate in said channel region, whereby the threshold voltage of the insulated gate field effect transistor is independent of the length of said channel region between said source and drain regions.

2. An insulated gate field effect transistor according to claim 1 wherein the impurity concentration of said high conductive regions is in the range from $1 \times 10^{16}$ to $2 \times 10^{16}$ cm$^{-3}$, the longitudinal dimension of said high conductive region is approximately 0.5μ, and the spacing between said source and drain region ranges from 1.5μ to 2μ.

3. An insulated gate field effect transistor according to claim 1 wherein with a desired threshold voltage $V_{th}$ (volt), a gate insulating layer thickness $T_{ox}$ (A) and a voltage $V_{sub}$ (volt) to be applied to said substrate during operation, an impurity concentration $N_A$ (cm$^{-3}$) of said substrate satisfies substantially the following equation:

$$N_A \simeq 3 \times 10^{21} \times (\frac{V_{th} + 0.4}{T_{ox}})^2 / V_{sub} .$$

4. An insulated gate field effect transistor according to claim 3 wheren $V_{th}$ is in the range from 0.3 volt to 1 volt, $T_{ox}$ is in the range from 300 A to 1000 A, $V_{sub}$ is in the range from 1 volt to 5 volt, and $N_A$ is in the range from $1 \times 10^{15}$ cm$^{-3}$ to $1 \times 10^{16}$ cm$^{-3}$.

* * * * *